United States Patent
Ray

(10) Patent No.: US 6,597,233 B2
(45) Date of Patent: Jul. 22, 2003

(54) DIFFERENTIAL SCSI DRIVER RISE TIME AND AMPLITUDE CONTROL CIRCUIT

(75) Inventor: Samuel T. Ray, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/865,830

(22) Filed: May 25, 2001

(65) Prior Publication Data

US 2002/0175717 A1 Nov. 28, 2002

(51) Int. Cl.[7] .............................................. H03K 17/56
(52) U.S. Cl. ..................... 327/424; 327/170; 327/306
(58) Field of Search ................................. 327/423, 424, 327/306, 178, 170, 564, 565, 566

(56) References Cited

U.S. PATENT DOCUMENTS

| | | | |
|---|---|---|---|
| 4,634,893 A | 1/1987 | Craycraft et al. | 326/57 |
| 4,808,855 A | 2/1989 | Lloyd | 326/86 |
| 4,841,313 A * | 6/1989 | Weiner | 347/128 |
| 5,311,081 A | 5/1994 | Donaldson et al. | 326/62 |
| 5,321,319 A * | 6/1994 | Mahmood | 326/57 |
| 5,336,948 A | 8/1994 | Jordan | 326/22 |
| 5,568,081 A | 10/1996 | Lui et al. | 327/380 |
| 5,717,345 A | 2/1998 | Yokomizo et al. | 326/80 |
| 5,818,260 A | 10/1998 | Kuo | 326/86 |
| 5,887,150 A | 3/1999 | Schneider et al. | 710/100 |
| 5,949,253 A | 9/1999 | Bridgewater, Jr. | 326/86 |
| 6,047,346 A | 4/2000 | Lau et al. | 327/158 |
| 6,051,990 A | 4/2000 | Uber | 326/33 |
| 6,069,504 A | 5/2000 | Keeth | 327/108 |
| 6,087,847 A | 7/2000 | Mooney et al. | 326/30 |
| 6,185,057 B1 * | 2/2001 | Masenas | 327/110 |
| 6,433,949 B1 * | 8/2002 | Murphy et al. | 360/48 |

* cited by examiner

Primary Examiner—Timothy P. Callahan
Assistant Examiner—Cassandra Cox
(74) Attorney, Agent, or Firm—McGinn & Gibb, PLLC; Richard A. Henkler, Esq.

(57) ABSTRACT

An SCSI circuit which allows for the independent control of driver slew rate and amplitude with a linear shaped driver output voltage. The circuit comprises 1) a symmetrical H-Driver having at least four predrive controls; and 2) a predrive control circuit coupled to one of the predrive controls for independently varying the amplitude and rise time. The SCSI circuit is designed to utilize minimal space on the IO circuit pad, thereby conserving the amount of space allotted by the silicon area on the integrated circuit chip.

17 Claims, 4 Drawing Sheets

DIFFERENTIAL SCSI DRIVER RISE TIME AND AMPLITUDE CONTROL CIRCUIT

BACKGROUND OF THE INVENTION

1. Field of the Invention

The present invention generally relates to a Small Computer System Interface (SCSI), and more particularly for an improved SCSI driver circuit configured in an H-Driver embodiment adapted for varying amplitudes and rise times.

2. Description of the Related Art

SCSI circuits are generally known in the art. An SCSI circuit is an independent input/output bus which allows a variety of peripheral devices to be connected to a personal computer system. The SCSI was initially developed to provide a disk drive interface that supported logical addressing of data rather than the more prevalent physical addressing. Additionally, the SCSI circuit was developed to transfer information in a parallel, byte-wise fashion instead of serially, thus, ending certain compatibility difficulties associated with developing new disk drive technologies. The electrical characteristics and signal protocols of the SCSI circuit were developed in such a manner that the requirements of various peripheral devices could be accommodated with relative ease and flexibility. In particular, the SCSI protocol defines a number of commands which are available for accessing and querying a particular peripheral device regarding the parameter set required for the device to operate correctly. This particular feature of the SCSI makes it possible for a system designer to write a software device driver program for a generalized peripheral device, without regard to device specific parameter set details.

Differential SCSI busses are terminated at each end, and have SCSI devices such as hard disk drives attached along the length of the bus, with a minimum spacing of 4 inches. These devices are stubs which are unterminated. The stubs load the bus with a lumped capacitance from each device's SCSI input/output (IO) driver, and effectively reduce the rise time at the far-end receiver, potentially causing timing errors. Additionally, backplanes are notorious for causing timing problems due to crosstalk, poor impedance control, and device spacing violations.

Adjustable driver rise times allow the user to optimize the driver for different bus configurations, and help minimize signal cross talk from faster than required edge rates. SCSI busses can also have a large attenuation loss due to series resistance in the cable and backplane. The loss can be as high as 6 db. Adjustable driver amplitudes allow the user to optimize the driver amplitude for the attenuation loss but also minimize signal cross talk from larger-than-required amplitudes. It is an important feature of these systems that the driver's rise time and amplitude are stable across the chip process and power supply, so chips from different process lots are interchangeable.

The optimum driver output signal waveform is linear. Moreover, having a constant rate of change between states enables the far-end receiver to generate a digital pulse with minimal duty cycle distortion. The slew rate is the time rate of change of the rising or falling edge of a signal. If there is a reduction in the slew rate after the differential voltage zero crossing, what results is a timing skew due to the receiver's finite gain. A linear shape, or constant slew rate, also enhances receiver noise immunity because the signal transits the critical +/−100 mv window at a constant rate. If the slew rate reduces during some portion of the rise or fall, then noise has a longer opportunity during that time to influence the receiver. Therefore, there is a need for a novel circuit design, which allows for independent control of both the amplitude and rise time for an SCSI differential driver.

SUMMARY OF THE INVENTION

In view of the foregoing and other problems, disadvantages, and drawbacks of the conventional SCSI circuits, the present invention has been devised, and it is an object of the present invention to provide a novel design for an SCSI circuit technique which allows for independent control of driver slew rate and amplitude with a linear shaped driver output voltage. The technique uses the silicon area on the integrated circuit chip efficiently, which is at a premium in the IO pad region. Moreover, the circuit has excellent process and power supply tolerances.

In order to attain the object(s) suggested above, there is provided, according to one aspect of the invention, an SCSI driver circuit comprising a symmetrical H-Driver having at least four predrive controls. The SCSI driver circuit has a predrive control circuit that includes an amplitude current digital-to-analog converter, a rise time current digital-to-analog converter, and an operational amplifier. The predrive control circuit is coupled to one of the predrive controls for varying the amplitude and rise time.

The amplitude current digital-to-analog converter and the rise time current digital-to-analog converter are independently controlled. The amplitude current digital-to-analog converter alters voltage on the operational amplifier to control an amplitude of signal output from the predrive control circuit. The rise time current digital-to-analog converter alters current on the operational amplifier to control a rate at which the signal output reaches the amplitude.

Each predrive control circuit further comprises a plurality of transistors and at least one diode configured to allow for the independent control of the amplitude and rise time, wherein the predrive control circuit yields a linear waveform output.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
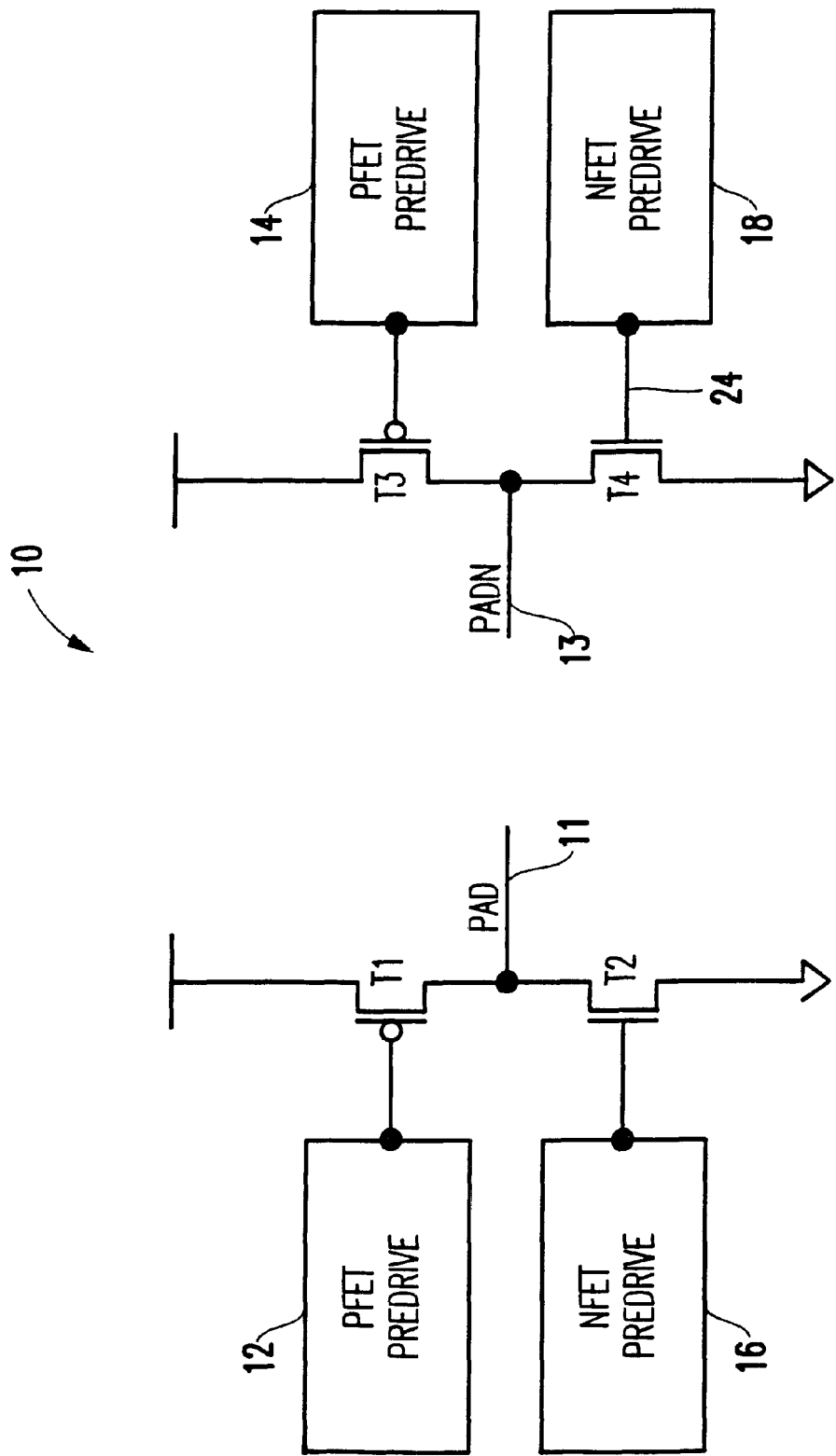
FIG. 1 is a circuit diagram of a small computer system interface driver according to the present invention.
Figure 2:
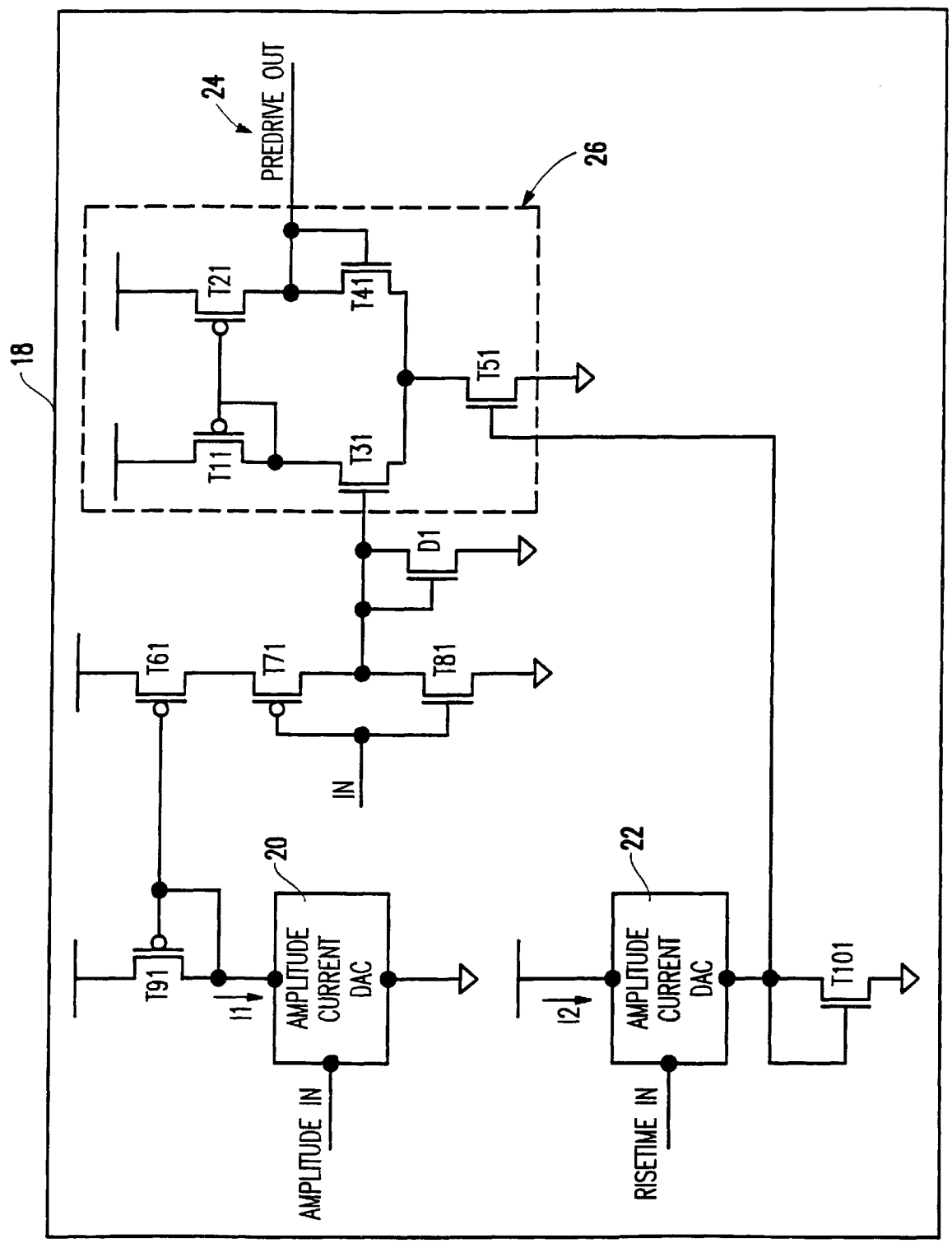
FIG. 2 is a circuit diagram of a small computer system interface driver according to the present invention.

As mentioned above, there is a need for a novel circuit design, which allows for independent control of both the amplitude and rise time for an SCSI differential driver. The invention addresses these needs by providing a unique circuit design, which efficiently utilizes silicon resources on an integrated circuit chip. In a preferred embodiment, the invention comprises a symmetrical H-Driver constructed with two pairs of predrive circuits, where each predrive circuit is designed such that the amplitude and rise time variables are independently controlled. The H-Driver may also be constructed in an asymmetrical design. An example of such a novel circuit design is shown in FIGS. 1–2. However, as would be known to one ordinarily skilled in the art given this disclosure, the invention is not limited to the example shown and is applicable to all similar structures. Referring now to the drawings, and more particularly to FIGS. 1–2, there are shown preferred embodiments of the structures according to the present invention.

Figure 4:
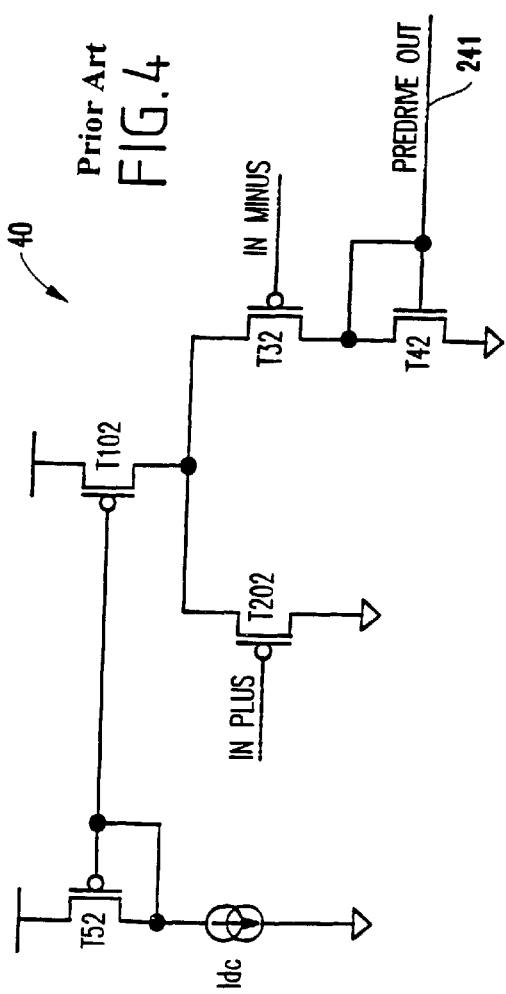
FIG. 4 is a circuit diagram of a traditional small computer system interface driver.

FIG. 4 shows a previous generation SCSI IO pad 40, which is not necessarily well-known and not necessarily prior art, at the time of this invention. Transistors T52 and T102 mirror a reference current Idc, which is steered by transistors T202 and T32 between ground and the diode connected transistor T42. The current in transistor T42 is mirrored to the H-Driver NFET 241.

This circuit shown in FIG. 4 gives an undesirable exponentially shaped waveform because the diode connected device transistor T42 behaves like a resistor in parallel with the H-Driver NFET gate capacitance. Moreover, independent rise time and amplitude control is complicated because both must act through transistor T42; such that increasing the amplitude by increasing Idc, causes the driver rise time to decrease. Here, the driver rise time tolerance is ±30% due to process and tracking. Also, the amplitude is dependent on the current through the diode, and the rise time is dependent on RC.

Figure 5:
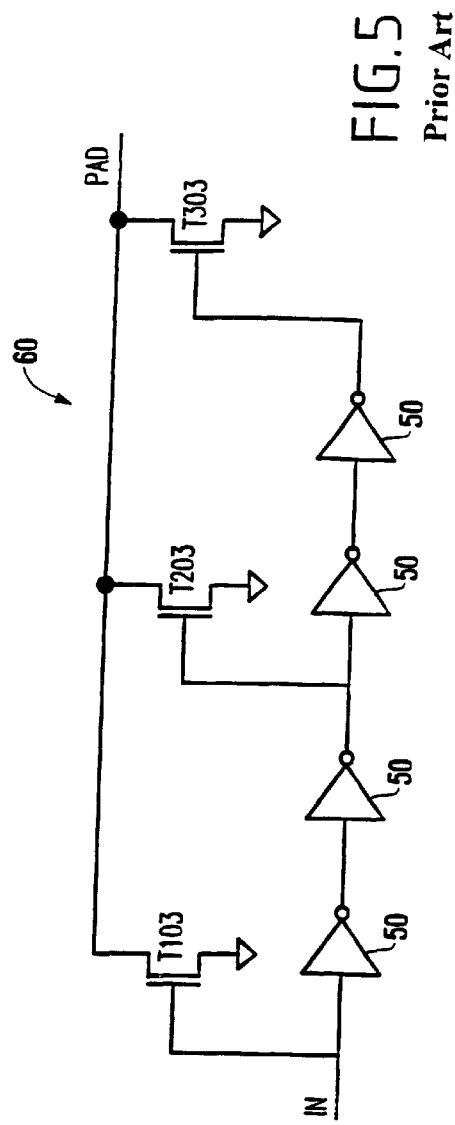
FIG. 5 is a circuit diagram of a traditional small computer system interface driver.

FIG. 5 shows how TTL (Transistor Transistor Logic) drivers have implemented rise time control in the past. This circuit design 60 is an attempted solution of the problems inherent with the circuit shown in FIG. 4 as described above, and once again is not necessarily well-known and not necessarily prior art, at the time of this invention. As shown in FIG. 5, multiple fingers shown comprising transistors T103, T203, and T303 are driven by a string of inverters 50, generating a staged delay of increasing current. However, this technique is very sensitive to power supply and process variations because of the reliance on digital logic delays.

In FIG. 1, an SCSI differential driver 10 is shown in its preferred symmetrical current mode H-Driver embodiment. The driver 10 comprises a plurality of transistors T1, T2, T3, T4 which supply a nominal 10 ma to a bus through PAD 11 and PADN 13. Transistors T1 and T4 conduct for the asserted state, while transistors T3 and T2 conduct during the negated state. The gates of transistors T1, T2, T3, T4 are driven by predrive circuits 12, 14, 16, 18, which provide the driver rise time and amplitude control. The predrives which turn off must do so at the same rate that the predrives which are turned on, such that there is a smooth transition between states, thereby resulting in a linear output waveform. Predrive circuits 12 and 14 are p-type circuits, while predrive circuits 16 and 18 are n-type circuits.

FIG. 2 shows one of the predrive circuits 18 first shown in FIG. 1. The PFET Predrive 12, 14 is structurally equivalent to the NFET Predrive 16, 18. The NFET Predrive 18 includes an operational amplifier 26, which is shown within the dashed lines in FIG. 2. The operational amplifier 26 further has transistors T11, T21, T31, T41, and T51 configured as a voltage follower. The NFET Predrive 18 further comprises a diode connected device D1 with current bias embodied in transistors T61, T71, T81. Moreover, a driver amplitude control is shown comprising transistor T91 and Amplitude Current Digital to Analog Converter (DAC) 20. A driver rise time control is also shown comprising transistor T101 and Rise Time Current Digital to Analog Converter (DAC) 22.

The voltage follower output node, Predrive Out 24, is connected to the H-Driver NFET (transistor T4 shown in FIG. 1). The Predrive Out 24 has a direct current (DC) value equal to the voltage at the gate of transistor T31 minus the sum of the gain error and input offset voltage of the operational amplifier 26. The voltage on the gate of T31 is either zero (node In=1) or is equal to the voltage Vgs of diode D1 with Ids=I1 (node In=0). The Amplitude Current DAC 20 is used to set different bias currents in diode D1, thus resulting in different driver amplitudes since the current through diode D1 is mirrored into the H-Driver NFET (transistor T4) by the ratio of the transistor widths.

The magnitude of the current I1 is set so as node amplitude In toggles between a 1 and 0. The gate voltage on transistor T31 is faster than the required H-driver rise time; thus the voltage follower output node Predrive Out 24 is slew rate limited by the operational amplifier bias current set in transistor T51, thereby charging the H-driver NFET gate capacitance. The Rise Time Current DAC 22 sets different bias currents I2 in transistor T51, and thus controls the H-Driver output rise times. Therefore, the amplitude and rise times are set independently through I1 and I2, respectively.

The Amplitude DAC 20 gets mirrored through transistors T91 and T61. If the node In is low (In=0), then the current goes through diode D1, where transistor T71 is on, and transistor T81 is off. If the node In is high (In=1), then the diode D1 is closed to ground, and transistor T81 goes on. Thus, the object is to achieve an accurate current in diode D1 because this is the current going through transistor T4 shown in FIG. 1.

Figure 3:
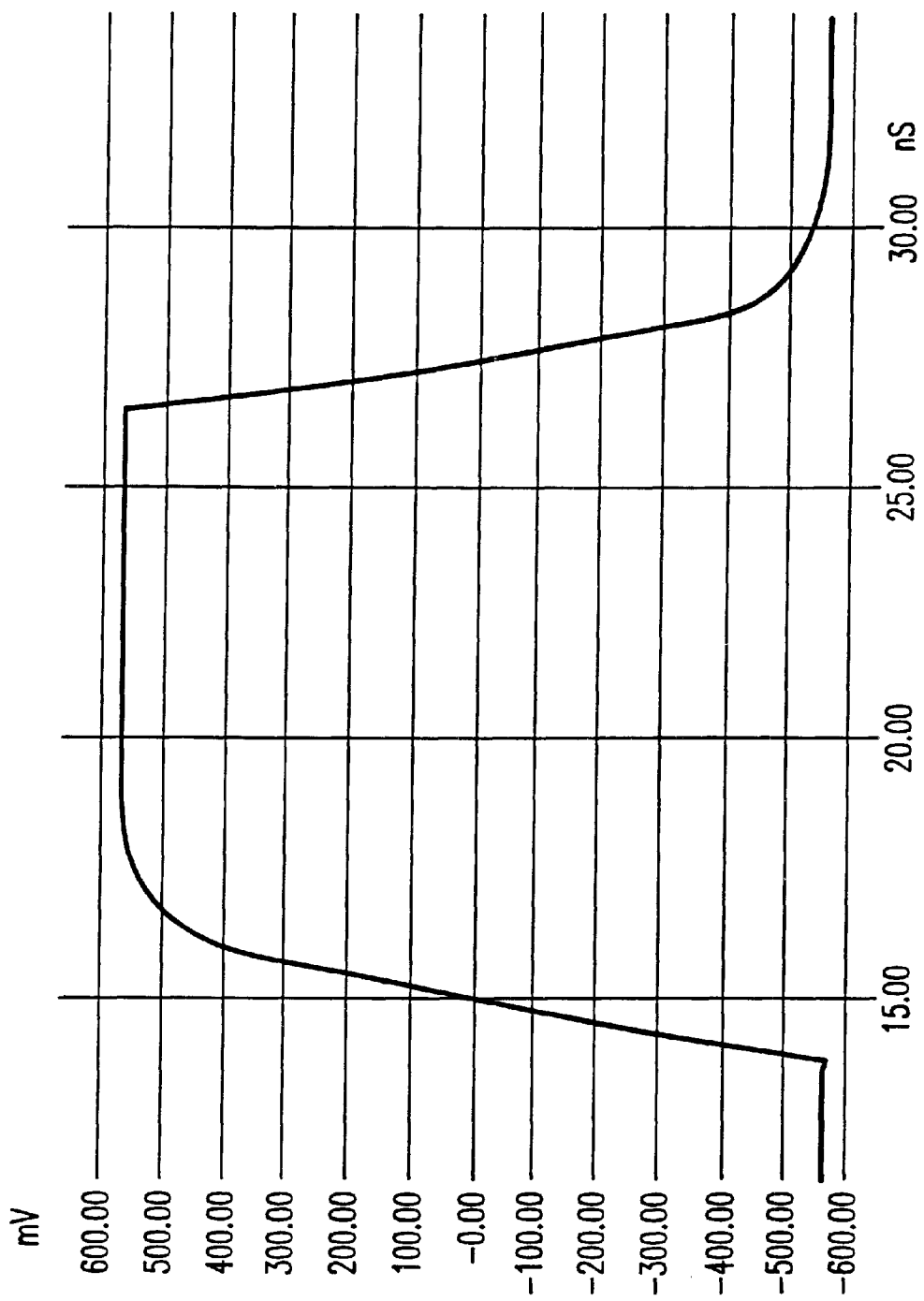
FIG. 3 is a graphical representation of the output voltage driver differential of the small computer system interface driver of FIG. 1.

The Rise Time DAC 22 gets mirrored through transistors T101 and T51. The current in T51 is equally split between T31 and T41 when the voltage on Predrive Out is equal to that on D1. If the voltages are not equal, then T51 limits the amount of current available to change the voltage on Predrive Out. This limited amount of current changes the voltage on Predrive Out at a constant rate because the limited current charges the capacitance on Predrive Out at a constant rate. FIG. 3, shows the driver differential output voltage at the 1.5 nsec Rise Time Current DAC setting. This plot shows the excellent linear shape inherent in the invention.

Therefore, as shown in FIG. 3, the invention allows the risetime (the time the signal takes to change from −600 mV to 600 mV) to be precisely controlled independently of the amplitude control. It is important that the risetime of a signal be sharp, but not too sharp. The invention allows the risetime to be increased or decreased to achieve the desired sharpness of signal. The signal should not be too sharp because risetimes which are smaller (sharper) than necessary contain additional high frequency harmonics which cause reflections that increase the bus settling times.

An important feature of the invention is the independence between the amplitude and risetime controls. As shown in FIG. 2, the current I1 that is controlled by the amplitude current DAC 20 is supplied to the diode D1 which generates a voltage at transistor T31. The voltage at transistor T31 is duplicated on the gate of transistor T41. Therefore, the current supplied by the amplitude current DAC 20 controls the voltage of the predrive out signal 24, which in turn, controls the amplitude of the driver shown in FIG. 1.

Independently of the foregoing, the current I2 provided by the risetime current DAC 22 directly controls the current which flows to transistor T51. The current flowing through transistor T51 directly affects the rate at which transistor T41 will develop the voltage on the predrive out 24. In this way, the current I2 directly controls the rate at which the signal will change (in this example from −600 mV to 600 mV).

The change in current thru T51 affects the precision that T41 is able to reproduce the voltage on D1. A smaller current increases the precision, a larger current decreases the precision. The present circuit has been designed so these changes are not significant.

T31 and T41 form a differential pair such that, if the voltage is higher on T31, then more current flows thru T31, and if the voltage is higher on T41, then more current flows thru T41. Because the gate of T41 is connected to "predrive out", the differential pair will become balanced when "predrive out" is equal to the voltage on D1.

To achieve a smooth linear shape, all transistors in the H driver must turn ON and OFF in a synchronous fashion. It is important that the control signals "amplitude in", "risetime in" and "in" shown in FIG. 2 be synchronized.

There are no differences in predrive 12, 14 because the H driver is symmetrical.

That is T1, T2, T3, T4 all have the same current when turned on. If the H driver is unsymmetrical, then Predrives 12, 14 would be similarly unsymmetrical, so that the currents in T1, T2, T3, T4 would all have the same turnon and turnoff rate.

The single stage operational amplifier 26, as shown in FIG. 2, provides enough open loop gain to minimize the gain error. Moreover, the H-Driver NFET gate capacitance provides the compensation necessary to give more than 45 degrees of phase margin at 1.0 nsec rise times. An operational amplifier with one stage of gain can be kept stable at 1 Ghz by using just enough gain to achieve the required diode DI to H-Driver NFET current mirror tolerance. Driver rise times and amplitude tolerance due to process and tracking, in the present circuit technique, are very good: ±20% (3 sigma). Furthermore, the sensitivity to the power supply is also very good since the current DACs are supplied a reference current which is referenced to the power supply. Because the amplitude is related to the constant current source, if the amplitude is too small, then the signal becomes too weak. Conversely, if the amplitude is too large, then it consumes too much power, which is also undesirable. Thus, the present circuit technique allows for the independent control of these variables.

The SCSI pad area using this circuit fits inside the predefined IO pad area, while other circuits are ⅓ bigger than the present design, and therefore must expand outside their predefined IO pad areas. The compact size of the predrive circuit contributes to a small SCSI pad.

The benefits of the present invention include independent control of risetime and amplitude and accurate control of risetime and amplitude. The chip power supply does not affect either because the DACs are referenced to an accurate current reference. The chip process affects rise time much less since the resistance of D1 is isolated from the risetime adjustment and a linear shaped waveform is output with a constant slew rate without RC chargeup effects.

The present invention also benefits several environments which would operate with the present circuit such as: systems utilizing magnetic recording such as Hard Disk Drives, tape storage, and audio tape, any integrated circuit which utilizes off chip drivers such as DRAM (Dynamic Random Access Memory) and SRAM (Static Random Access Memory) memories, CPUs (Central Processing Unit), and ASICs (Application Specific Integrated Circuits).

While the invention has been described in terms of preferred embodiments, those skilled in the art will recognize that the invention can be practiced with modification within the spirit and scope of the appended claims.

What is claimed is:

1. An SCSI driver circuit comprising:
an H-Driver; and
at least one predrive control circuit within said H-Driver, wherein said predrive control circuit includes independent controls for signal amplitude and signal rise time.

2. An SCSI driver circuit comprising:
an H-Driver; and
at least one predrive control circuit within said H-Driver, wherein said predrive control circuit includes independent controls for signal amplitude and signal rise time,
wherein said H-Driver is asymmetrical and further comprises at least four predrive controls.

3. The SCSI driver circuit of claim 2, wherein said at least four predrive controls further comprise at least one p-type predrive control, and at least one n-type predrive control.

4. An SCSI driver circuit comprising:
an H-Driver;
a predrive control circuit within said H-Driver, wherein said predrive control circuit includes an amplitude current digital-to-analog converter and a rise time current digital-to-analog converter,
wherein said amplitude current digital-to-analog converter and said rise time current digital-to-analog converter are independently controlled.

5. The SCSI driver circuit of claim 4, wherein the predrive control circuit further comprises an operational amplifier, wherein:
said amplitude current digital-to-analog converter alters a voltage on said operational amplifier to control an amplitude of signal output from the predrive control circuit; and
said rise time current digital-to-analog converter alters a current on said operational amplifier to control a rate at which said signal output reaches said amplitude.

6. The SCSI driver circuit of claim 5, wherein said H-Driver is symmetrical and further comprises at least four predrive controls.

7. The SCSI driver circuit of claim 4, wherein said H-Driver is asymmetrical and further comprises at least four predrive controls.

8. The SCSI driver circuit of claim 6, wherein said at least four predrive controls further comprise at least one p-type field effect transistor, and at least one n-type field effect transistor.

9. An SCSI driver circuit comprising:
an H-Driver;
a predrive control circuit within said H-Driver; wherein said predrive control circuit includes an operational amplifier, an amplitude current digital-to-analog converter, and a rise time current digital-to-analog converter,
wherein, said amplitude current digital-to-analog converter and said rise time current digital-to-analog converter are independently controlled,
wherein, said amplitude current digital-to-analog converter alters a voltage on said operational amplifier to control an amplitude of signal output from said predrive control circuit; and
wherein said rise time current digital-to-analog converter alters a current on said operational amplifier to control a rate at which said signal output reaches said amplitude.

10. The SCSI driver circuit of claim 9, wherein said H-Driver is asymmetrical and further comprises at least four predrive controls.

11. The SCSI driver circuit of claim 10, wherein said at least four predrive controls further comprise at least one p-type field effect transistor, and at least one n-type field effect transistor.

12. An SCSI driver circuit comprising:

an H-Driver having at least four predrive controls;

a predrive control circuit within said H-Driver; wherein said predrive control circuit includes an amplitude current digital-to-analog converter, a rise time current digital-to-analog converter, wherein said amplitude current digital-to-analog converter and said rise time current digital-to-analog converter are independently controlled; and an operational amplifier, wherein said amplitude current digital-to-analog converter alters a voltage on said operational amplifier to control an amplitude of signal output from said predrive control circuit; and said rise time current digital-to-analog converter alters a current on said operational amplifier to control a rate at which said signal output reaches said amplitude, and wherein said at least four predrive controls further comprise at least one p-type field effect transistor, and at least one n-type field effect transistor.

13. The SCSI driver circuit of claim 12, wherein said H-Driver is symmetrical.

14. An SCSI driver circuit comprising:

a driver; and at least one predrive control circuit within said driver, wherein said predrive control circuit includes independent controls for signal amplitude and signal rise time.

15. An SCSI driver circuit comprising:

a driver; and at least one predrive control circuit within said driver, wherein said predrive control circuit includes independent controls for signal amplitude and signal rise time, wherein said at least one predrive control circuit comprises:

an amplitude current digital-to-analog converter; and a rise time current digital-to-analog converter, wherein said amplitude current digital-to-analog converter and said rise time current digital-to-analog converter are independently controlled.

16. An SCSI driver circuit comprising:

a driver; and at least one predrive control circuit within said driver, wherein said predrive control circuit includes independent controls for signal amplitude and signal rise time, wherein said predrive control circuit further comprises an operational amplifier, and wherein:

said amplitude current digital-to-analog converter alters a voltage on said operational amplifier to control an amplitude of signal output from the predrive control circuit; and said rise time current digital-to-analog converter alters a current on said operational amplifier to control a rate at which said signal output reaches said amplitude.

17. An SCSI driver circuit comprising:

a driver; and at least one predrive control circuit within said driver, wherein said predrive control circuit includes independent controls for signal amplitude and signal rise time, wherein said driver is symmetrical and further comprises at least four predrive controls.

* * * * *